(12) United States Patent
Wang et al.

(10) Patent No.: US 7,449,800 B2
(45) Date of Patent: Nov. 11, 2008

(54) POWER CONTROL SYSTEM

(75) Inventors: Weesyk Wang, Taipei (TW); Michael Yang, Taipei (TW)

(73) Assignee: Inventec Corporation (TW)

( * ) Notice: Subject to any disclaimer, the term of this patent is extended or adjusted under 35 U.S.C. 154(b) by 203 days.

(21) Appl. No.: 11/476,960

(22) Filed: Jun. 27, 2006

(65) Prior Publication Data

US 2007/0296279 A1   Dec. 27, 2007

(51) Int. Cl.
*H01H 47/00* (2006.01)
*H02H 3/00* (2006.01)
*G06F 13/00* (2006.01)
*H05K 7/10* (2006.01)

(52) U.S. Cl. .................. 307/125; 361/89; 710/302; 710/304

(58) Field of Classification Search ............. 307/125, 307/112; 361/93.1; 710/302, 304
See application file for complete search history.

(56) References Cited

U.S. PATENT DOCUMENTS 5,519,264 A * 5/1996 Heyden et al. ............. 307/125
6,188,210 B1 * 2/2001 Tichauer et al. ........... 323/273
6,225,797 B1 * 5/2001 Willis et al. ............... 323/351
2005/0231874 A1 * 10/2005 Hussein et al. ............ 361/93.1

* cited by examiner

*Primary Examiner*—Stephen W Jackson
*Assistant Examiner*—Michael Rutland Wallis
(74) *Attorney, Agent, or Firm*—Peter F. Corless; Steven M. Jensen; Edwards Angell Palmer & Dodge LLP

(57) ABSTRACT

A power control system for use in an electronic device provided with a transforming module becoming self-contained upon connection with a power supply includes a switch module, a delay module, and a control module. The switch module turns on or off a power input route whereby the transforming module can supply power to the electronic device, and keeps the power input route at an off state while the transforming module remains unconnected to the power supply. The delay module performs a delay process and generates delay signals. The control module receives the delay signals generated and enables the switch module to turn on the power input route. The present invention prevents the stability of the electronic device from being deteriorated as a result of electric sparks induced by metallic friction and excessive instantaneous current while the electronic device is being connected to the power supply.

7 Claims, 2 Drawing Sheets

POWER CONTROL SYSTEM

BACKGROUND OF THE INVENTION

1. Field of the Invention

The present invention relates to power control techniques, and more particularly, to a power control system for preventing electric sparks from being generated during a connection process when an electronic device is connected to a power supply.

2. Description of Related Arts

A conventional method for supplying power is to connect a plug of an electronic device such as a personal computer provided with an adaptor to a socket, whereas electric sparks may easily be generated when connecting the plug to the socket because of metallic friction between the plug and the socket and excessive instantaneous current when connecting the electronic device to the power supply. The electric sparks may not only affect normal operations of the electronic device, but also damage electronic components in the electronic device which may bring much economic loss to manufacturers and users.

Moreover, as connecting the electronic device to the power supply is performed by hands, incomplete contact between the plug and the socket may occur because of incorrect operation of hands, thereby the stability of power may be deteriorated.

As a result, the present subject to be solved is to provide a power control system for preventing electric sparks from being generated when connecting an electronic device to a power supply, such that defects in the prior art can be avoided.

SUMMARY OF THE INVENTION

In views of the above-mentioned defects of the prior art, it is a primary objective of the present invention to provide a power control system for use in an electronic device, such that electric sparks which cause abnormal operations and damage of electronic components in the electronic device can be prevented from being generated when connecting the electronic device to a power supply.

It is another objective of the present invention to provide a power control system in order to prevent the stability of the power from being deteriorated, which is caused by incorrect operation in the prior art.

To achieve the above-mentioned and other objectives, a power control system for use in an electronic device provided with a transforming module becoming self-contained upon connection with a power supply is provided in the present invention. The power control system comprises a switch module which is electrically connected to the transforming module for turning on or off a power input route whereby the transforming module can supply power to the electronic device, and keeping the power input route at an off state while the transforming module remains unconnected to the power supply; a delay module which is electrically connected to the transforming module for performing a delay process of the power and generating delay signals; and a control module which is electrically connected to the switch module and the delay module for receiving the delay signals generated by the delay module and enabling the switch module to turn on the power input route. Wherein, the transforming module is an adaptor.

In one preferred embodiment, the switch module comprises a first switch unit which is electrically connected to the control module for sending a trigger signal when receiving a control signal generated by the control module; and a second switch unit which is electrically connected to the first switch unit for turning on the power input route when receiving the trigger signal sent by the first switch unit. The first switch unit is a NMOS transistor, and the second switch unit is a PMOS transistor. The delay process is to make the power provided by the transforming module to delay a predetermined time; wherein the delay module is a delay circuit composed of a resistor and a capacitor, and the predetermined time is decided by a resistance of the resistor and a capacitance of the capacitor. Moreover, the control module a divider circuit composed of resistors.

Compared with the prior art, the instantaneous current is close to zero when connecting the transforming module of the electronic device to the power supply as the power control system of the present invention can turn on the power input route of the electronic device after a delayed time, such that electric sparks induced by excessive instantaneous current and metallic friction when connecting the electronic device to the power supply can be eliminated, and damage of components in the electronic device caused by the electric sparks can also be avoided.

Furthermore, the power input route of the transforming module is turned on after a predetermined time when the electronic device is connected to the power supply. That is to say, power is supplied to the electronic device after the power of the transforming module is stable. Therefore, the stability of the power being deteriorated caused by incorrect operation can be prevented from occurrence.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
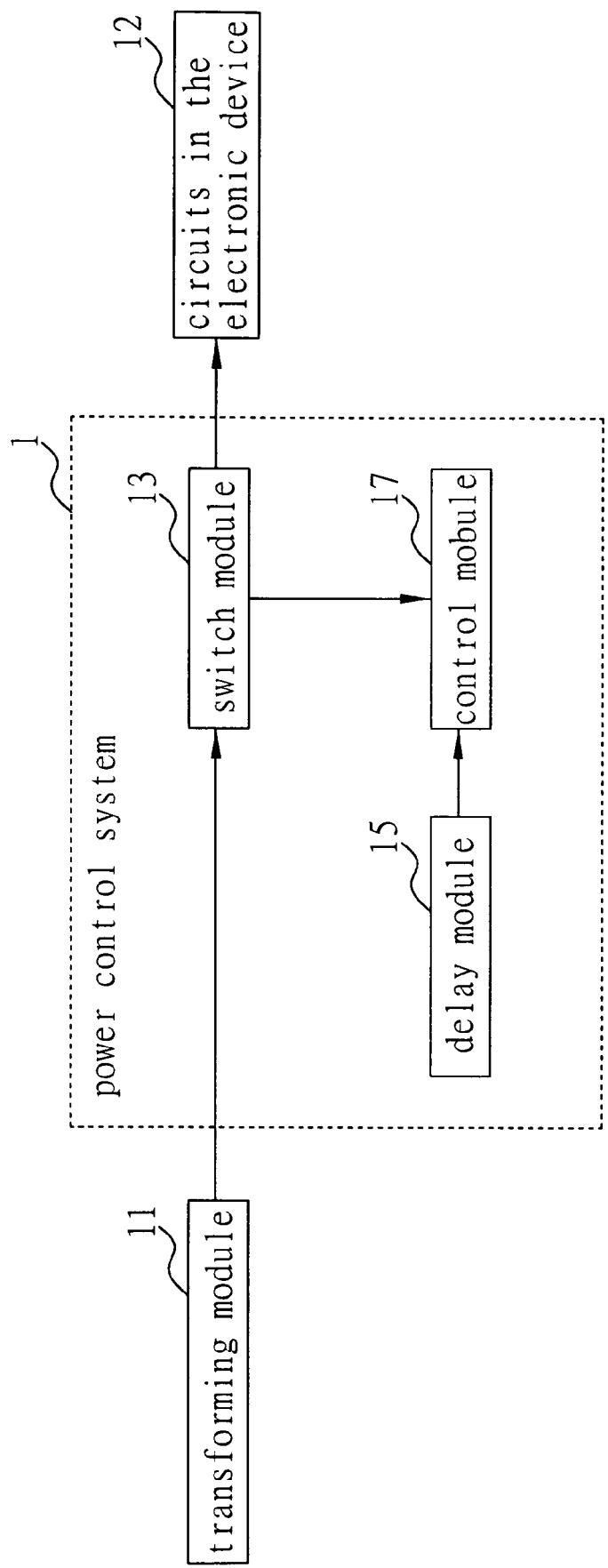
FIG. 1 is a functional block diagram of a power control system according to the present invention.

Please refer to FIG. 1, which is a functional block diagram of a power control system 1 according to the present invention. The power control system 1 is applied in an electronic device, such as a personal computer, a notebook computer and a television. The electronic device includes a transforming module 11 for connecting to an external power and transforming power supplied by the external power to the electronic device. According to the embodiment, the transforming module 11 is an adaptor.

As shown in FIG. 1, the power control system 1 of the present invention comprises a switch module 13, a delay module 15, and a control module 17.

The switch module 13 is electrically connected to the transforming module 11 for turning on or off a power input route whereby the transforming module 11 can supply the power to the electronic device, and keeping the power input route at an off state while the transforming module 11 is not connecting to the power supply. More particularly, the switch module 13 is used for turning on or off the power input route over which power signals supplied by the adaptor 11 are transmitted to internal circuits 12 of the electronic device while a plug of the adaptor 11 is electrically connected to a socket.

The delay module 15 is electrically connected to the transforming module 11 for performing a delay process on the power supplied by the transforming module 11 and generating delay signals. The delay process makes the power supplied by the transforming module 11 to be delayed a predetermined time. According to the embodiment, the delay module 15 is a resistor-capacitor (RC) delay circuit having a resistor and a capacitor, and the predetermined time is decided by a resistance of the resistor and a capacitance of the capacitor.

The control module 17 is electrically connected to the switch module 13 and the delay module 15 for receiving the delay signals generated by the delay module 15 and enabling the switch module 13 to turn on the power input route.

Furthermore, a preferred circuit structure of the power control system 1 of the present invention is described in the following paragraphs in conjunction with FIG. 2, which is an embodiment showing a detailed circuit of the power control system 1 according to the present invention.

Figure 2:
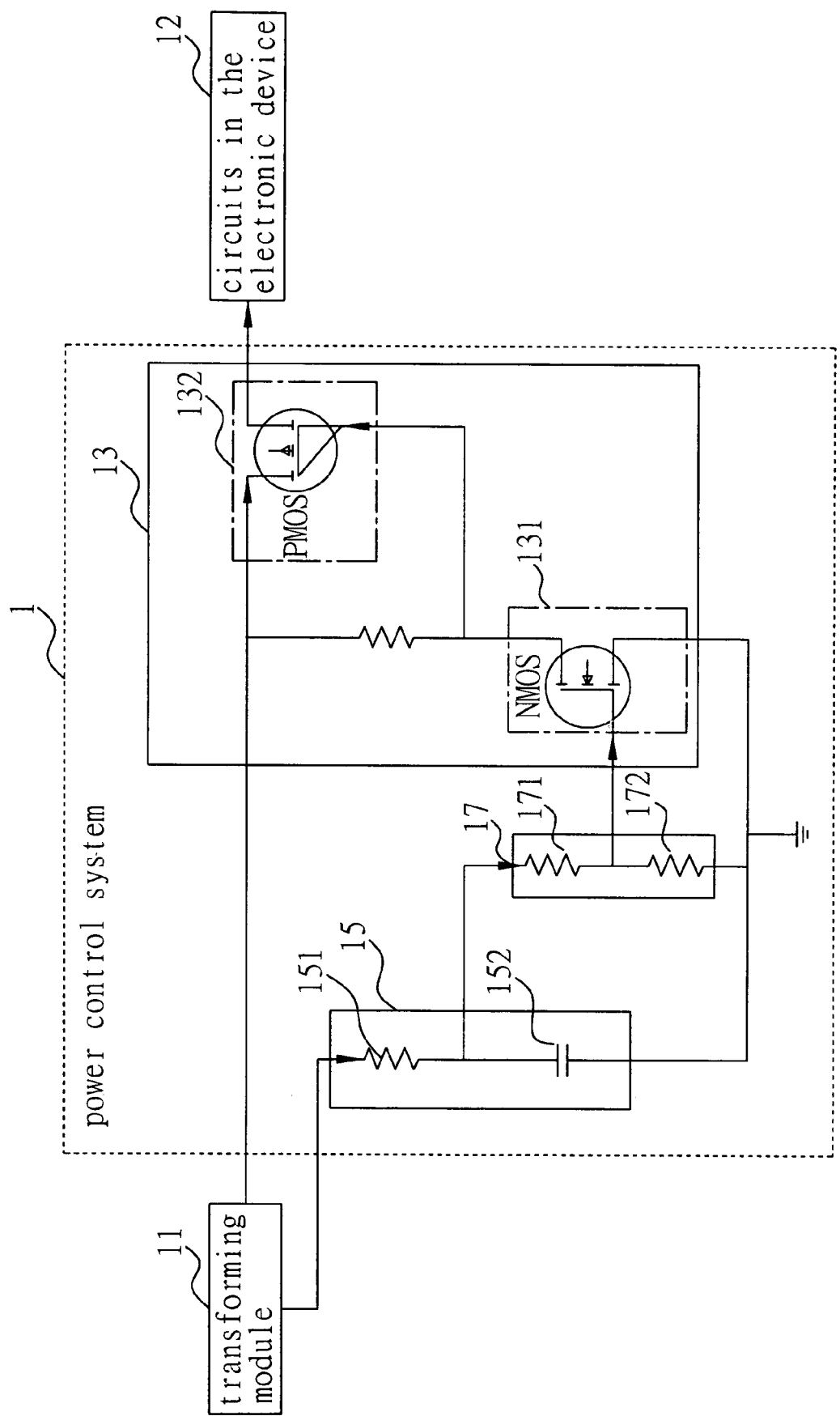
FIG. 2 is an embodiment showing a detailed circuit of a power control system according to the present invention.

As shown in FIG. 2, the switch module 13 comprises a first switch unit 131 and a second switch unit 132. The first switch unit 131 is electrically connected to the control module 17 for sending a trigger signal when receiving a control signal generated by the control module 17. The second switch unit 132 is electrically connected to the first switch unit 131 for turning on the power input route when receiving the trigger signal sent by the first switch unit 131. As shown in FIG. 2, the first switch unit 131 is a NMOS transistor having a source connected to ground, a drain connected to the transforming module 11, and a gate connected to the control module 17. Accordingly, the second switch unit 132 is a PMOS transistor having a source connected to the transforming module 11, a drain connected to the internal circuits 12 of the electronic device, and a gate connected to the drain of the NMOS.

It should be noted that the amount and types of the switch components (the NMOS transistor and the PMOS transistor) of the switch module 13 are not limited thereto, and other components with switch character such as CMOS transistor or JFET can also be used herein.

The delay module 15 is an RC delay circuit having a resistor 151 and a capacitor 152, and is used for delaying the power supplied from the transforming module 11 by a predetermined time, which is decided by a resistance of the resistor 151 and a capacitance of the capacitor 152.

The control module 17 is a voltage dividing circuit having a resistor 171 and a resistor 172 connected in series with the resistor 171. The gate of the NMOS (the first switch unit) 131 is connected between the resistor 171 and the resistor 172. That is to say, a voltage division output by the resistors 171 and 172 is a control signal received by the first switch unit 131.

The working principles of the present embodiment are described as follows: when the transforming module 11 is connected to the power supply, the capacitor 152 of the delay circuit 15 is firstly charged to provide a voltage to the divider circuit 17 after a predetermined time, then the voltage is divided at the connection between the resistor 171 and the resistor 172 to turn on the NMOS 131, and the drain of the NMOS 131 which is connected to the gate of the PMOS 132 is at a low voltage to turn on the PMOS 132, such that the power input route between the transforming module 11 and the circuits in the electronic device 12 is turned on, accordingly power supplied to the circuits in the electronic device 12 is delayed a predetermined time after the transforming module 11 is connected to the power supply.

As a result, the power of the transforming module is delayed a predetermined time by the delay module when connecting the transforming module of the electronic device to the power supply, and the divided voltage is generated to trigger the switch module to turn on the power input route between the transforming module and the circuits in the electronic device by use of the power control system of the present invention, thereby the instantaneous current is close to zero and power supplied to the circuits in the electronic device is delayed a predetermined time after the transforming module is connected to the power supply. Therefore, electric sparks induced by excessive instantaneous current and metallic friction when connecting the electronic device to the power supply can be eliminated, and damage of components in the electronic device caused by the electric sparks can also be avoided.

Furthermore, the power input route of the transforming module is turned on after a predetermined time when the electronic device is connected to the power supply. That is to say, power is supplied to the electronic device after the power of the transforming module is stable. Therefore, the stability of the power being deteriorated caused by incorrect operation can be prevented from occurrence.

In summary, the foregoing descriptions are only the preferred embodiment and not restrictive of the technical scope of the present invention. The essential technical contents of the present invention are widely defined in the appended claims. All embodiments or methods accomplished by others which are the same as the definitions of the following claims or other equivalents should be considered as falling within the scope of the claims.

What is claimed is:

1. A power control system applied in an electronic device having a transforming module for transmitting power supplied by a power supply to the electronic device when connected to the power supply, the power control system comprising:

a switch module electrically connected to the transforming module for turning on or off a power input route whereby the transforming module supplies the power to the electronic device, and keeping the power input route at an off state while the transforming module is not connecting to the power supply, the switch module comprising a first switch unit and a second switch unit electrically connected to the first switch unit;

a delay module electrically connected to the transforming module for performing a delay process on the power and generating delay signals that lag behind the power by a predetermined time; and a voltage dividing circuit electrically connected between the first switch unit of the switch module and the delay module for generating a control signal when receiving the delay signals generated by the delay module, wherein the first switch unit, when receiving the control signal generated by the voltage dividing circuit, sends a trigger signal to enable the second switch unit to turn on the power input route when receiving the trigger signal.

2. The power control system of claim 1, wherein the first switch unit is an NMOS transistor.

3. The power control system of claim 1, wherein the second switch unit is a PMOS transistor.

4. The power control system of claim 1, wherein the delay process makes the power supplied by the transforming module to be delayed by a predetermined time.

5. The power control system of claim 4, wherein the delay module is a delay circuit having a resistor and a capacitor.

6. The power control system of claim 5, wherein the predetermined time is decided by a resistance of the resistor and a capacitance of the capacitor.

7. The power control system of claim 1, wherein the transforming module is an adaptor.

* * * * *